(12) United States Patent
Villermet et al.

(10) Patent No.: US 6,177,134 B1
(45) Date of Patent: Jan. 23, 2001

(54) PROCESS AND PLANT FOR THE PRODUCTION OF A GASEOUS MIXTURE CONTAINING A CARRIER GAS AN OXIDIZING GAS AND A SILANE

(75) Inventors: Alain Villermet, Viroflay; François Coeuret, Guyancourt; Panayotis Cocolios, Bullion; Michel Inizan, Conde sur Vesgre, all of (FR)

(73) Assignee: L'Air Liquide, Societe Anonyme pour l'Etude et l'Exploitation des Procedes Goerges Claude, Paris (FR)

( * ) Notice: Under 35 U.S.C. 154(b), the term of this patent shall be extended for 0 days.

(21) Appl. No.: 09/007,333

(22) Filed: Jan. 15, 1998

(30) Foreign Application Priority Data

Jan. 15, 1997 (FR) .................................................. 97 00344

(51) Int. Cl.[7] .................................................. C23C 16/00
(52) U.S. Cl. .............................. 427/255.28; 427/255.37; 427/255.393
(58) Field of Search .................................. 427/575, 579, 427/580, 255.37, 255.28, 255.393

(56) References Cited

U.S. PATENT DOCUMENTS

| | | |
|---|---|---|
| 3,808,035 | 4/1974 | Stelter . |
| 4,002,512 * | 1/1977 | Lim .................................... 350/96.12 |
| 4,045,594 * | 8/1977 | Maddocks .............................. 427/99 |
| 4,239,811 * | 12/1980 | Kemlage ................................ 427/95 |
| 4,788,082 * | 11/1988 | Schmitt ............................. 427/248.1 |
| 4,992,306 * | 2/1991 | Hochberg et al. ................. 427/255.3 |
| 5,040,046 | 8/1991 | Chhabra et al. . |
| 5,262,356 | 11/1993 | Fujii . |
| 5,576,076 * | 11/1996 | Slootman et al. .................... 427/579 |
| 5,728,224 * | 3/1998 | Laurent et al. ....................... 427/582 |

FOREIGN PATENT DOCUMENTS 622474  11/1994 (EP) .

OTHER PUBLICATIONS

"Controlled Oxidation of Silane", K. Strater, RCA Review, vol. 29, 1968, pp. 618–629.

"Preparation and Properties of SiO2 Films Deposited from SiH4 and O2", Hammond et al., *Transactions of the Metallurgical Society of Aime*, vol. 242, 1968, pp. 546–550.

* cited by examiner

Primary Examiner—Shrive Beck
Assistant Examiner—Bret Chen
(74) Attorney, Agent, or Firm—Burns, Doane, Swecker & Mathis, L.L.P.

(57) ABSTRACT

Process for the production of a final gaseous mixture comprising a carrier gas, an oxidizing gas and a silane, with a predetermined content of each of the three gaseous components, comprising the steps of:

a) preparing a primary gaseous mixture comprising a neutral gas and the silane, wherein the silane is present in the primary gaseous mixture at a content below a self-ignition limit of that particular silane in air;

b) providing a first gas stream, comprising the carrier gas and a controlled residual content of the oxidizing gas;

c) preparing the final mixture according to one or other of the following two procedures, as a function of the residual content of oxidizing gas in the gas stream comprising the carrier gas:

P1: mixing the first gas stream with a second stream of the primary gaseous mixture and with a third stream of the oxidizing gas in proportions which make it possible to obtain the final mixture, the addition of the oxidizing gas stream being carried out under dynamic conditions;

P2: mixing the first gas stream with a second stream of the primary gaseous mixture, in proportions which make it possible to obtain the final mixture, the addition of the primary mixture stream being carried out under dynamic conditions.

19 Claims, 4 Drawing Sheets

PROCESS AND PLANT FOR THE PRODUCTION OF A GASEOUS MIXTURE CONTAINING A CARRIER GAS AN OXIDIZING GAS AND A SILANE

BACKGROUND OF THE INVENTION (i) Field of the Invention

The present invention relates to the field of the preparation of gaseous mixtures containing a silane and an oxidant, in particular carrier gas/oxidizing gas/silane ternary mixtures.

An example which may be mentioned of a technology using atmospheres containing these three types of gases is surface treatment operations performed on polymer substrates by the deposition, under dielectric-barrier electrical discharge, of silicon-based films or layers at the surface of such substrates, with the aim in particular of improving certain properties of such polymer substrates, such as their wettability by inks or adhesives, and also the adhesion of these inks or adhesives to the substrates.

The notion of "film" or "layers" must be understood as meaning the preparation of a continuous or non-continuous deposit, thus including the depositing of only isolated blocks which may cover, for example, only 10 to 15% of the surface of the polymer film.

(ii) Description of Related Art

Reference may be made to the documents EP-A-516,804 and EP-A-622,474, both on behalf of the Applicant Company, which relate to such processes for depositing silicon-based films on polymer substrates.

The very specific properties of silanes mean that it is, in practice, very difficult and expensive to prepare and handle such ternary mixtures.

These properties are well known to a person skilled in the art; here, it will be simply and briefly recalled, taking the example of the monosilane (generally abbreviated to "silane"), that the difficulties of handling silane relate to two aspects:

a) Its self-ignition in the presence of oxygen

This self-ignition property makes it difficult and expensive to handle silane, because it is necessary to use leaktight plants employing isolation valves and other purge lines.

By way of illustration, the self-ignition of monosilane will depend on numerous parameters, such as the supply pressure of the gas, temperature, rate of ejection of the gas or hygrometry. The concentration limit of monosilane in a carrier gas, as generally accepted in the literature, beyond which the mixtures will be regarded as inflammable or spontaneously inflammable, lies between 1 and 4%, depending on the reference source.

b) The formation of particles:

The act of bringing a silane and an oxidant together can result in the formation of silica particles. These particles, by accumulating, can not only obstruct the pipes (and thus dangerously increase the pressure upstream) but, moreover, can damage the various components of the plant, such as valves, flow controllers or other pressure-reducing valves.

As regards the stability of mixtures containing a silane and an oxidant, reference may in particular be made to the article by K. Strater, which appeared in RCA Review in December 1968, in which the author is concerned with the stability of $O_2/N_2/SiH_4$, $CO_2/N_2/SiH_4$ and $N_2O/N_2/SiH_4$ mixtures and in which he demonstrates that the stability of such mixtures at ambient temperature is demonstrated up to 0.8% of monosilane in the mixture.

These results may suggest the following comments:

on the one hand, it may be observed that this upper stability limit is too low for certain applications involving silane and an oxidant and for which a higher silane concentration in the mixture is required;

depending on the equipment used, it would seem difficult to take the risk of forming silica powder, it being known that, in places, for reasons of homogeneity of the mixture, this limit of 0.8% may be exceeded.

By way of example, the standard use of mass flow controllers employing a capillary seems very risky, even below the concentration limit put forward in this article by K. Strater.

In a way which is consistent with these results, mention may be made of another example from the literature, by M. L. Hammond and M. H. Bowers (which appeared in Transactions of the Metallurgical Society of AIME, March 1968), which relates to the CVD deposition of silica layers on wafers, starting with $O_2/N_2/SiH_4$ mixtures. The equipment used to produce the mixtures employs a conventional gas distribution panel where the three gas lines arrive, the mixtures manufactured thus having a silane content varying from 0.06 to 0.3% by volume and thus very low silane contents.

On reconsidering the example of the deposition of silicon-based films on polymer substrates, by dielectric-barrier electrical discharge, it is then found that, in practice, rather than premixing, it is preferable to convey the various gases constituting the atmosphere separately to different points of the electrical discharge region.

It will be appreciated, therefore, that such separate injections of the various components of the required atmosphere give rise to significant variations in the composition of the treatment atmosphere in the discharge space, which does not allow true control of the composition of the atmosphere to be achieved and thus true reproducibility of the quality of the treatment of the film to be achieved.

Studies completed by the Applicant Company, in particular for the example of plants for the surface treatment of polymer films, show that the gaseous mixtures can be frequently, and for relatively long periods of time, brought to a halt. This is because it is commonplace for the user to bring his production/conversion line to a halt, for example during a maintenance operation or an operation in which the type of film to be treated is changed or alternatively mechanical problems, the surface treatment then being interrupted, which causes the gaseous flow to halt and thus the gaseous mixtures produced prior to the stoppage to be brought to a halt in a large portion of the pipes.

SUMMARY AND OBJECTS OF THE INVENTION

The object of the present invention is in particular to introduce a solution to the technical problems discussed above.

The studies completed by the Applicant Company in this field have demonstrated that it is possible to introduce such a technical solution by the combined employment of the following stages:

preparing the final gaseous mixture (which thus contains a carrier gas, for example a neutral gas or alternatively a mixture of a neutral gas and of a reducing gas such as hydrogen, an oxidizing gas and a silane), in at least two stages, by first preparing a gaseous mixture, which can be described as "primary", which contains a neutral gas and the silane, the silane content in the primary gaseous mixture being below the self-ignition limit of the silane in air; and the primary gaseous mixture thus formed is mixed with a stream of the carrier gas and, if appropriate, a stream of the oxidizing gas (depending on the residual content of oxidizing gas in the carrier gas), in proportions which make it possible to obtain the required final mixture, the addition of the primary mixture stream or of the oxidizing gas stream, to prepare this final mixture, being carried out under dynamic conditions.

The expression "dynamic conditions" must here be understood as meaning that the stage of addition of the primary mixture stream or the oxidizing gas stream, to produce the final gaseous mixture, is carried out under conditions where the gaseous flowrates employed are never zero and there is never any dead space, any area of stagnant or recirculating gas, which might promote reaction between the two types.

Examples of the implementation of such additions under dynamic conditions will be illustrated later and it will then be seen that it is particularly recommended to avoid the use of conventional buffer tanks for producing such a ternary mixture.

DETAILED DESCRIPTION OF PREFERRED EMBODIMENTS

Figure 1:
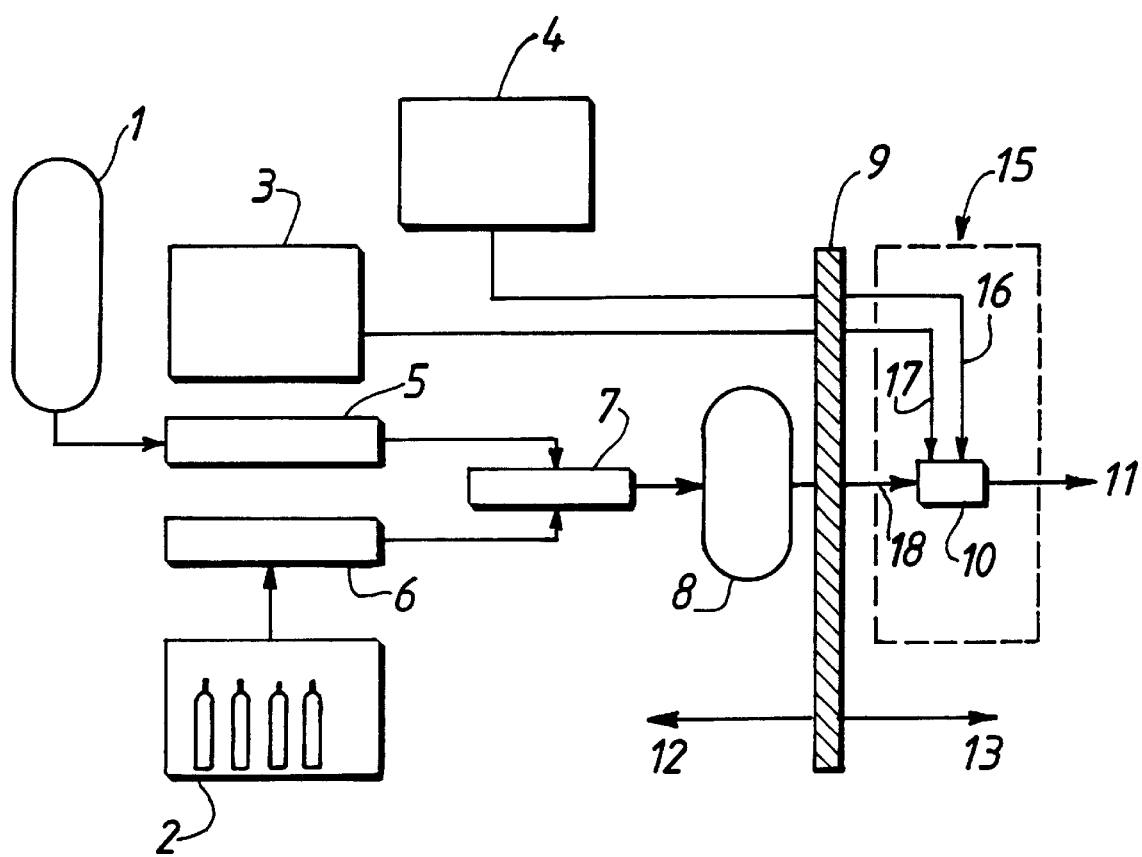
FIG. 1 is a diagrammatic representation of a plant suitable for the implementation of the process according to the invention.

The process according to the invention for the production of a final gaseous mixture containing a carrier gas, an oxidizing gas and a silane, with a predetermined content of each of the three gaseous components, thus comprises the implementation of the following stages:

a) a primary gaseous mixture containing a second neutral gas and the said silane is prepared, the silane content in the primary gaseous mixture being below the self-ignition limit of that particular silane in air;

b) a first gas stream, containing the said carrier gas, with a controlled residual content of the said oxidizing gas, is available;

c) the required final mixture is prepared according to one or other of the following two procedures, as a function of the residual content of oxidizing gas in the said first gas stream containing the said carrier gas:

P1: the said first gas stream is mixed with a second stream of the said primary gaseous mixture and with a third stream of the oxidizing gas, in proportions which make it possible to obtain the required final mixture, the addition of the oxidizing gas stream being carried out under dynamic conditions;

P2: the said first gas stream is mixed with a second stream of the said primary gaseous mixture, in proportions which make it possible to obtain the required final mixture, the addition of the primary gas stream being carried out under dynamic conditions.

According to one of the implementations of the invention, the mixing according to the procedure P1 is carried out in two stages:

i) an intermediate mixture between the said first gas stream and the said primary gaseous mixture second stream is prepared; and ii) the said third stream of the oxidizing gas is added to the intermediate mixture in proportions which make it possible to obtain the required final mixture.

Advantageously, the final mixture prepared according to the invention will be homogenized due to the fact that the pipe in which the said first gas stream moves adopts, downstream of the points for addition of the said primary mixture second stream and of the said third stream of the oxidizing gas, in the case of the procedure P1, or downstream of the point for addition of the said primary gaseous mixture second stream, in the case of the procedure P2, a coil shape.

As indicated above, the first gas stream contains the carrier gas, "carrier gas" according to the invention, which can, for example, be a neutral gas (such as, for example, nitrogen, argon or helium) or alternatively a mixture of a neutral gas and of a reducing gas, such as hydrogen.

As will have been understood on reading the preceding part, the terminology "second neutral gas" was used to call to mind the composition of the primary mixture, in order to clearly signify the fact that the neutral gas forming part of the composition of the primary mixture can be different from the neutral gas forming part of the composition of the carrier gas.

According to one of the implementations of the invention, the said first gas stream is a nitrogen stream of cryogenic origin.

According to another implementation of the invention, the said first gas stream is an impure nitrogen stream, obtained by separation from air by permeation or adsorption, containing a residual oxygen content. The residual oxygen content in such a first gas stream is then advantageously between 0.1% and 12% by volume.

According to another implementation of the invention, the said first gas stream is a dry air stream.

According to one of the implementations of the invention, the said gas stream containing the carrier gas is a neutral gas and use is then made, as second neutral gas participating in the production of the primary mixture, of the same neutral gas as that constituting the carrier gas.

Mention may be made, as "silane" which can be employed in the context of the present invention, of linear or branched silicon hydrides of formulae $Si_nH_{2n+2}$, in which n represents a number between 1 and 4, such as monosilane ($SiH_4$), disilane or trisilane, halogenated silicon hydrides, such as $SICl_4$ [sic], $SiH_2Cl_2$, $SiHCl_3$, $SiH_3Cl$ or alternatively $SiHCl_3$ [sic], alkoxysilanes, such as tetraethoxysilane, or alternatively organosiloxanes.

According to one of the aspects of the invention, the silane used is monosilane.

As will also be clearly apparent to a person skilled in the art, the "oxidizing gas" according to the invention can be highly varied, depending on the contemplated application of the final mixture. Mention may nevertheless here be made, by way of illustration, of oxygen, $CO_2$, $N_2O$, $NO_2$ or alternatively mixtures of such oxidizing gases.

According to one of the aspects of the invention, the oxidizing gas employed is oxygen or a gas containing oxygen, such as air.

According to one of the implementations of the invention, the final gaseous mixture obtained is directed to at least one user point where a surface treatment operation is performed on polymer films by deposition, under dielectric-barrier electrical discharge, of a silicon-based layer on the film.

The expression "layer" (deposited on the film) must be understood according to the invention as meaning the notion already stated above in the present application.

As will be clearly apparent to a person skilled in the art on reading everything which precedes, the process for the preparation of a mixture according to the invention can be adapted to the various sources of gases available on the gases market (thus, for example, to preprepared mixtures, to mixtures prepared on site, to the production of nitrogen on site by separation from air by permeation or adsorption, and the like) and thus in particular to the possible residual content of an oxidizing gas in the gas stream which comprises the carrier gas.

Thus, for example, in the case already indicated where the first gas stream is a nitrogen stream of cryogenic origin and thus virtually free of impurities (oxygen content less than 10, even 5 ppm), the procedure P1 will advantageously be applied by addition, to the cryogenic nitrogen stream, of a primary gaseous mixture second stream and of an oxidizing gas third stream under the conditions already described (the oxidizing gas can be, for example, oxygen, air, a source of $N_2O$ and the like).

Still by way of example, in the case where the first gas stream is an impure nitrogen stream obtained by separation from air by permeation or adsorption and thus containing a significant residual oxygen content, the procedure P2 will advantageously be applied (thus using the oxidant stock already contained in the first gas stream) by addition, to the impure nitrogen stream, of a second stream of the primary gaseous mixture under the conditions already described.

As a third example, in the case where the first gas stream is a dry air stream thus containing nearly 21% oxygen, the procedure P2 as described above will advantageously be applied.

It is thus understood that it is possible to suit all gas situations by adopting, according to circumstances, the procedure P1 or the procedure P2, in order to prepare the final mixture under the required dynamic conditions.

As will also be clearly apparent to a person skilled in the art, the "final" carrier gas/silane/oxidizing gas mixture according to the invention can have a composition which is highly variable and adaptable, depending on the targeted application.

By way of illustration, taking the example of mixtures used for depositions of silicon-based films on polymer substrates, it will be possible to envisage, for example, the following mixtures:

Ex. 1: A final $N_2/SiH_4/N_2O$ mixture (flow rate of a few tens of $Nm^3/h$), the silane content of which is between 100 and 5000 ppm and the $N_2O$ content of which is advantageously 2 to 4 times that of the silane in the mixture, the mixture having been obtained according to the procedure P1 from a nitrogen gas of cryogenic origin first stream, a preprepared nitrogen/silane primary mixture second stream (silane content of less than 1.9%) and a nitrous oxide stream in proportions which make it possible to achieve the desired final composition, the addition of the nitrous oxide stream being carried out under dynamic conditions.

Ex. 2: A final $N_2/SiH_4/O_2$ mixture (flow rate of a few tens of $Nm^3/h$), the silane content of which is between 100 and 5000 ppm and the oxygen content of which will be chosen greatly in excess with respect to that of the silane in the mixture, the mixture having been obtained according to the procedure P2 from a nitrogen gas first stream, the gas having been obtained by separation from air by permeation, and from a preprepared nitrogen/silane primary mixture second stream (silane content of less than 1.9%) in proportions which make it possible to achieve the desired final composition, the addition of the primary mixture stream being carried out under dynamic conditions.

Other characteristics and advantages of the present invention will emerge from the following description of embodiments, which description is given by way of illustration and without implied limitation with respect to the appended drawings, in which:

FIG. 1 illustrates the case of a plant suitable for the implementation of the process according to the invention used successfully for supplying a treatment device for polymer films.

A source 1 of neutral gas (for example, a cryogenic nitrogen stock) and a source 2 of monosilane in the gaseous state (for example, storage as bottles of pure monosilane) are recognized in FIG. 1.

The references 5 and 6 in the diagram respectively represent means for distributing the neutral gas and the monosilane, known to a person skilled in the art and which will thus not be detailed here, which make it possible to supply a mixer 7 in order to prepare the primary gaseous mixture (with a silane content below the self-ignition limit of silane in air) and to store the primary gaseous mixture thus formed in a buffer tank 8.

It should be noted that the use here of such a buffer tank proves to be entirely advantageous in being able to continuously provide the required final mixture to a treatment device 11, even when the supplying of gas upstream of the line is, for one reason or another, temporarily interrupted; for example, in the case of filling the storage tank 1 with liquid nitrogen or alternatively in the case where the process of changing the silane bottles at the source 2 is under way.

The buffer tank 8 supplies, via the gas line 18, the mixing region referenced 15 in the figure (which will be described in detail later in the context of FIG. 3) with primary gaseous mixture, which region 15 is, moreover, supplied with oxidizing gas originating from the source 3, via the gas line 17, and with gas which contains the carrier gas originating from the source 4, via the gas line 16.

Reference 9 has been used to symbolize what can constitute an external wall of the user site where the treatment device 11 is situated, in order to illustrate a specific embodiment in which the predilution stage (7) is carried out outside (12) the user site, whereas the final mixing between the primary gaseous mixture, the oxidizing gas and the carrier gas is carried out inside (13) the user site.

Use may be made here, by way of illustration, of two different sources of neutral gas: the first source 1, which can, for example, be composed of racks of nitrogen bottles, and a second source 4, which can, for example, be composed of liquid nitrogen.

This employment of two different sources of neutral gas in particular corresponds to the law in certain countries (for example France), where the handling of neutral/silane mixtures demands two different sources of neutral gas, assuming the neutral gas is also used for other inerting applications on the site:

a first source for preparing the neutral/silane mixture;

a second source, not only for bringing the mixture to completion, in order to achieve the desired composition, but also for supplying the other applications of the site;

in order to avoid, in the case where silane may have ascended in the neutral gas pipe, supplying the other points of the user site, which require nitrogen for inerting applications (in particular from the safety viewpoint), with a mixture in fact containing silane.

A case has been represented here where the sources 3 and 4 are separate. As indicated above, it is also possible to envisage, according to the invention, combining the sources 3 and 4 into a single gas source which comprises the carrier gas and a certain residual concentration of the oxidizing gas, which can, for example, be obtained by an adsorption or permeation air separator.

Still by way of illustration, mention may be made of other gas sources suitable for forming the sources 3 and 4.

Thus, on considering the case of the oxidizing gas source 3, while, as already indicated, it is possible to use a "simple" source, such as a preprepared mixture of one or more oxidizing gases in a carrier gas or alternatively a permeation or adsorption air separator providing nitrogen with a given and controlled oxygen content, it is also possible to envisage (depending on the resources of the user site concerned) the use of more "complex" sources, such as a nitrogen containing a controlled content of $CO_2$ and $H_2O$ [sic] resulting from the low-temperature catalyzed reaction between a hydrocarbon and an impure nitrogen containing oxygen produced by separation from air by permeation or adsorption.

Likewise, on considering the case of the carrier gas source 4, while simple sources can be envisaged, such as a source of neutral gas produced by the cryogenic route, other types of sources can also be envisaged depending on the resources of the user site, such as a pure nitrogen obtained by catalytic deoxygenation of an impure primary nitrogen produced by separation from air by permeation or adsorption, for example in the following way:

the impure nitrogen (containing oxygen) is reacted with hydrogen over a platinum catalyst in order to form a nitrogen containing water vapor and less than 10 ppm of residual oxygen, water vapor removed downstream on a dryer;

the impure nitrogen (containing oxygen) is reacted with a hydrocarbon over a platinum catalyst, at low temperature, in order to form a nitrogen containing $CO_2$, water vapor and optionally traces of residual hydrocarbon, if it has been used in excess, the $CO_2$ and $H_2O$ being removed downstream over appropriate purification means.

Figure 2:
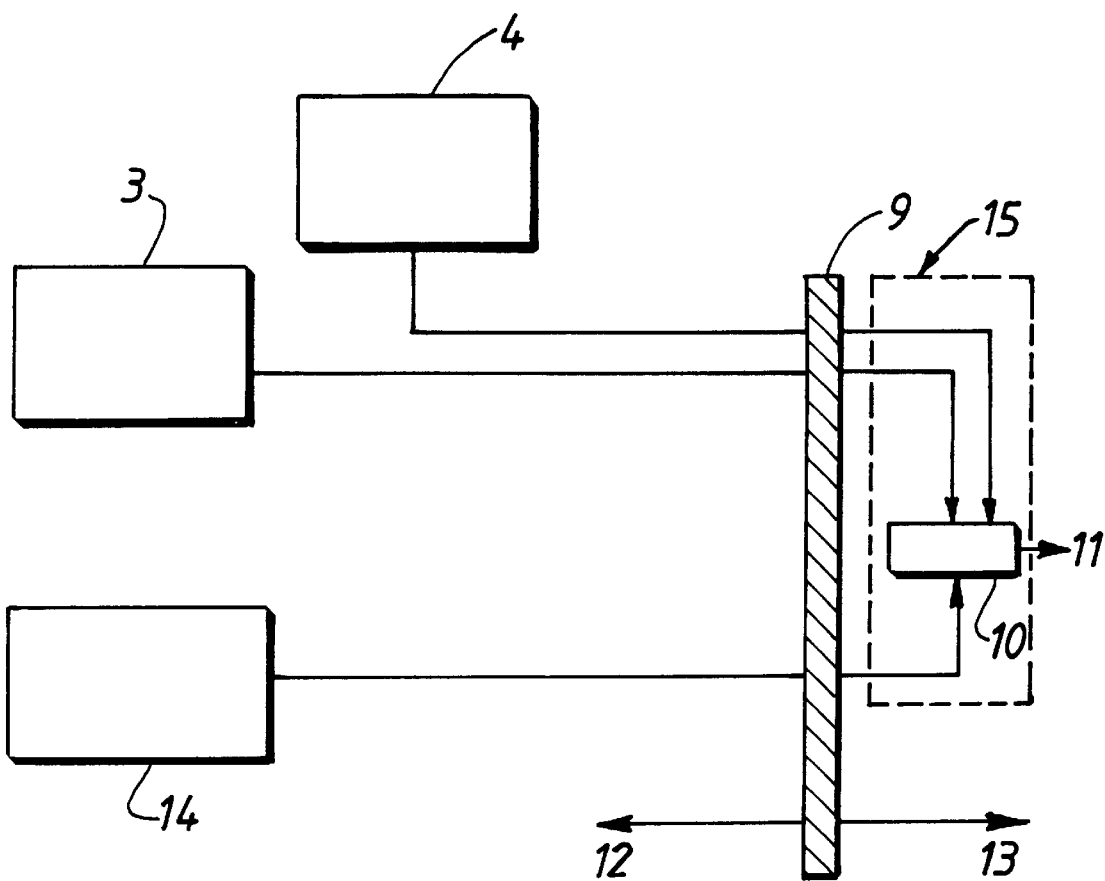
FIG. 2 is a diagrammatic representation of another plant suitable for the implementation of the process according to the invention.

FIG. 2 illustrates another plant suitable for the implementation of the process, the design of which is similar to that represented in the context of FIG. 1 but has been simplified with respect to it in that the primary gaseous mixture diluted with silane is not manufactured on site as in the case of FIG. 1 but is already available as a source 14, for example composed of bottles of nitrogen/silane mixture containing 2% silane in nitrogen.

The absence of buffer tank 8 is also found for this embodiment but it is possible, for example (to ensure the safety/continuity of supply mentioned in the context of FIG. 1), to use 2 or more racks of bottles in parallel, with replacement of the racks as they are used up.

The same comments can be made here relating to the diversity of the possible sources 3 and 4 as those already made in the context of FIG. 1.

Figure 3:
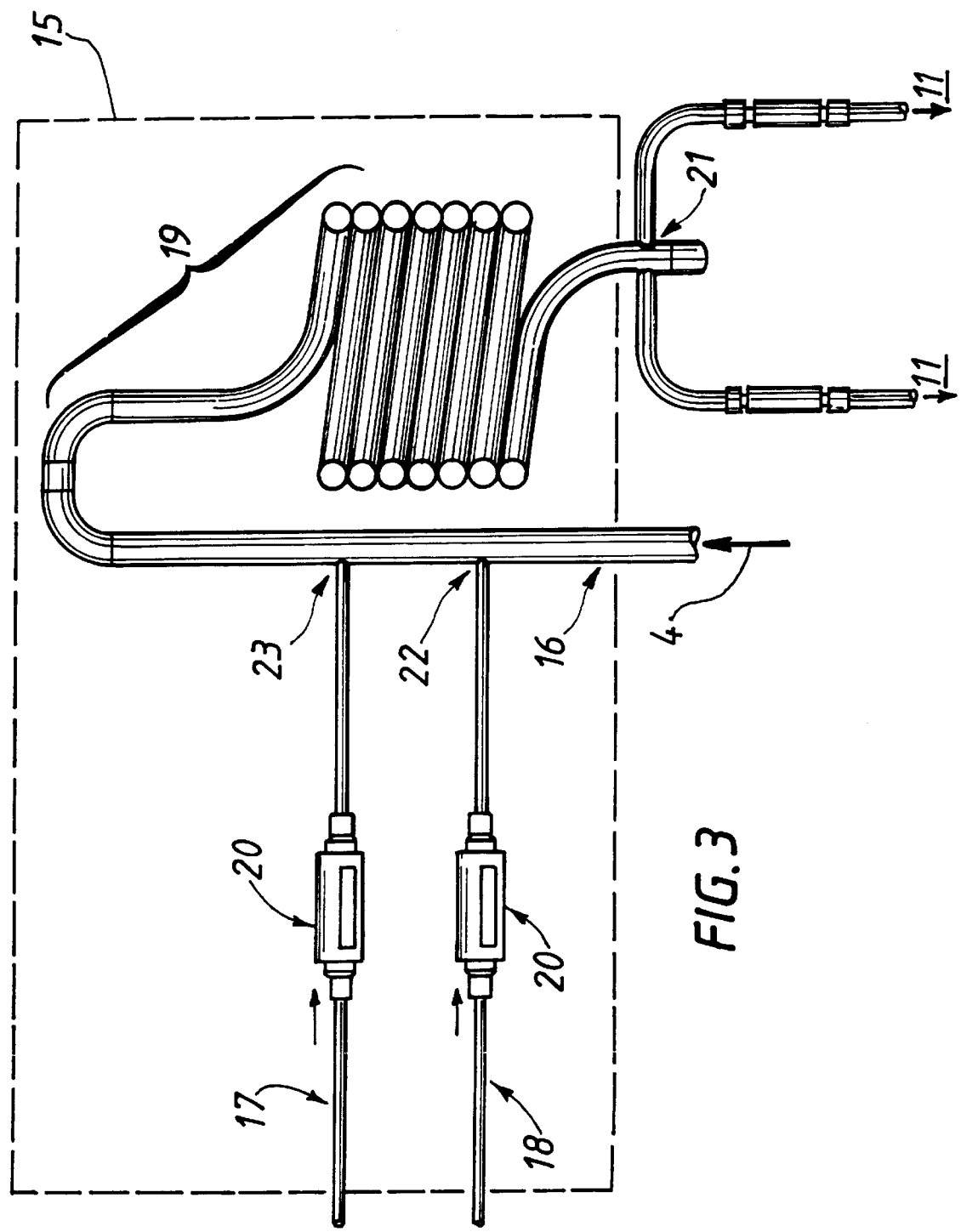
FIG. 3 is a detailed representation of an embodiment of the stage of carrier gas/oxidizing gas/silane mixing "under dynamic conditions" according to the invention (detail of the rectangle referenced 15 in FIG. 1)

FIG. 3 illustrates a specific embodiment of the mixing region 15 under dynamic conditions, mixing carried out between the silane/neutral primary gaseous mixture (with a silane content below the self-ignition limit of silane in air), reaching the mixing region via the pipe 18, the oxidizing gas (for example oxygen), reaching the mixing region via the pipe 17, and a gas stream containing the gas reaching the mixing region via the pipe 16.

As described in detail later in the context of examples, the dimensions of the pipes have been arranged to take into account a carrier gas 4 flow rate greater, indeed in some cases very much greater, than the flow rate employed in the pipes 17 and 18, on account of the composition of the required final mixture but also so as to ensure that the gas velocity in the main pipe 16 (carrier) can be greater than the gas velocity in the other pipes.

In more detail, on returning to the cases of the procedure P1 and of the procedure P2:

in the case of the procedure P1: a gas velocity in the main pipe (carrier gas) greater than the gas velocity in the "oxidizing gas" pipe, indeed greater than the gas velocity in the two other oxidizing gas and primary gas pipes, will preferably be provided;

in the case of the procedure P2: a gas velocity in the main pipe (carrier gas) greater than the gas velocity in the "primary mixture" pipe will preferably be provided.

A factor X between the gas velocity in the main pipe and the gas velocity or velocities (depending on the cases mentioned above) in the other pipe or pipes of greater than 1 and advantageously being of an order of size of several tens, indeed several hundreds, will then preferably be adopted. Thus, by way of illustration, in the case P1, a factor X of 100 or even 200 between the gas velocity in the main pipe (carrier gas) and the gas velocity in the "oxidizing gas" pipe has been used with success to prepare nitrogen/silane/nitrous oxide ternary mixtures under dynamic conditions.

It is then found, on returning to FIG. 3, that oxidizing gas added to the pipe 16 is immediately entrained by the strong carrier gas flow moving in the pipe 16, without, at any time, the silane (originating from the pipe 18) and the oxidizing gas (originating from the pipe 17) being able to stagnate in this pipe 16, which would promote the formation of silica powder between these two types.

The addition of oxidizing gas thus having been carried out under fully dynamic conditions, additional homogenization between the three types takes place in the plant because of the fact that the pipe 16 adopts, downstream of the points for connection 22 and 23 of the pipes 17 and 18, a coil structure (shown diagramatically in 19), in the turns of which the mixture moves without ever, at any time, encountering angles-or stagnation or recirculation dead spaces, thus promoting complete homogenization of the required final mixture before the latter reaches the point in the plant symbolized by 21, where the final mixture can be distributed to the user point or points of the site.

The example of a case where the final mixture is distributed to two treatment devices of the user site or alternatively to two injection points of the same treatment device 11 has been illustrated in this FIG. 3.

It is thus seen, the embodiment illustrated in the context of this FIG. 3 makes it possible to carry out, under completely dynamic conditions, on the one hand, the addition of the oxidizing gas stream to the mixture containing the silane but also the possible homogenization of the ternary gaseous mixture thus formed.

This FIG. 3 only illustrates one of the embodiments which can be envisaged to obtain such a result; mention may also be made, by way of illustration, of the mixers sold by the company Sulzer Chemtech.

According to an advantageous embodiment of the invention, the primary mixture containing the silane and the oxidizing gas will be brought into contact in the plant at a point as close as possible to the user point 11. This is because it is understood that, in such a configuration, halting the treatment device 11 (for example in the case of the stoppage of the production/conversion line or alternatively in a case where it is necessary to change the polymer film to be treated) which [sic] will generally result in the supplies of gas originating from the various sources of the site being halted and the pipes being purged. By adopting such an embodiment, only a few meters of pipes containing the silane and the oxidant will potentially be affected by powder formation and thus are to be purged.

For a first implementational example, a plant such as that described in the context of FIG. 2, incorporating a mixing region 15 such as that described in detail in the context of FIG. 3, was used to supply a plant for the surface treatment of polypropylene films with the nitrogen/oxygen/silane mixture.

The plant treated bi-oriented polypropylene films with a width in the region of 1 m, the rate of forward progression of the film in the treatment device being, on average, 50 m/min.

The desired ternary mixture had to contain 200 ppm of silane and approximately 5% oxygen.

The plant of FIG. 2 was, in this case, employed using a source 14 of monosilane $SiH_4$ composed of bottles containing 1.9% $SiH_4$ in nitrogen (production flowrate: 370 l/h) and sources 3 and 4, combined in a single source, composed of a membrane-route air separator producing a 95% impure nitrogen, thus containing a residual oxygen content of 5% (production oxidizing gas flowrate: 35 $Nm^3/H$), for a silane content in the overall mixture of 200 ppm.

For a second implementational example, a plant such as that described in the context of FIG. 2, incorporating a mixing region 15 such as that described in detail in the context of FIG. 3, was used to supply, with nitrogen/$N_2O$/silane mixture, the same plant for the surface treatment of polypropylene films as that considered in the context of Example 1 (BOPP films with a width in the region of 1 m, progressing forward in the treatment device, on average, at 50 m/min).

The desired ternary mixture had to contain 200 ppm of silane and 800 ppm of $N_2O$.

The plant of FIG. 2 was, in this case, employed using a source 14 of monosilane $SiH_4$ composed of bottles containing 1.9% $SiH_4$ in nitrogen and a source 3 of oxidizing gas composed of bottles of $N_2O$ gas, the source 4 being a nitrogen stock of cryogenic origin.

Figure 4:
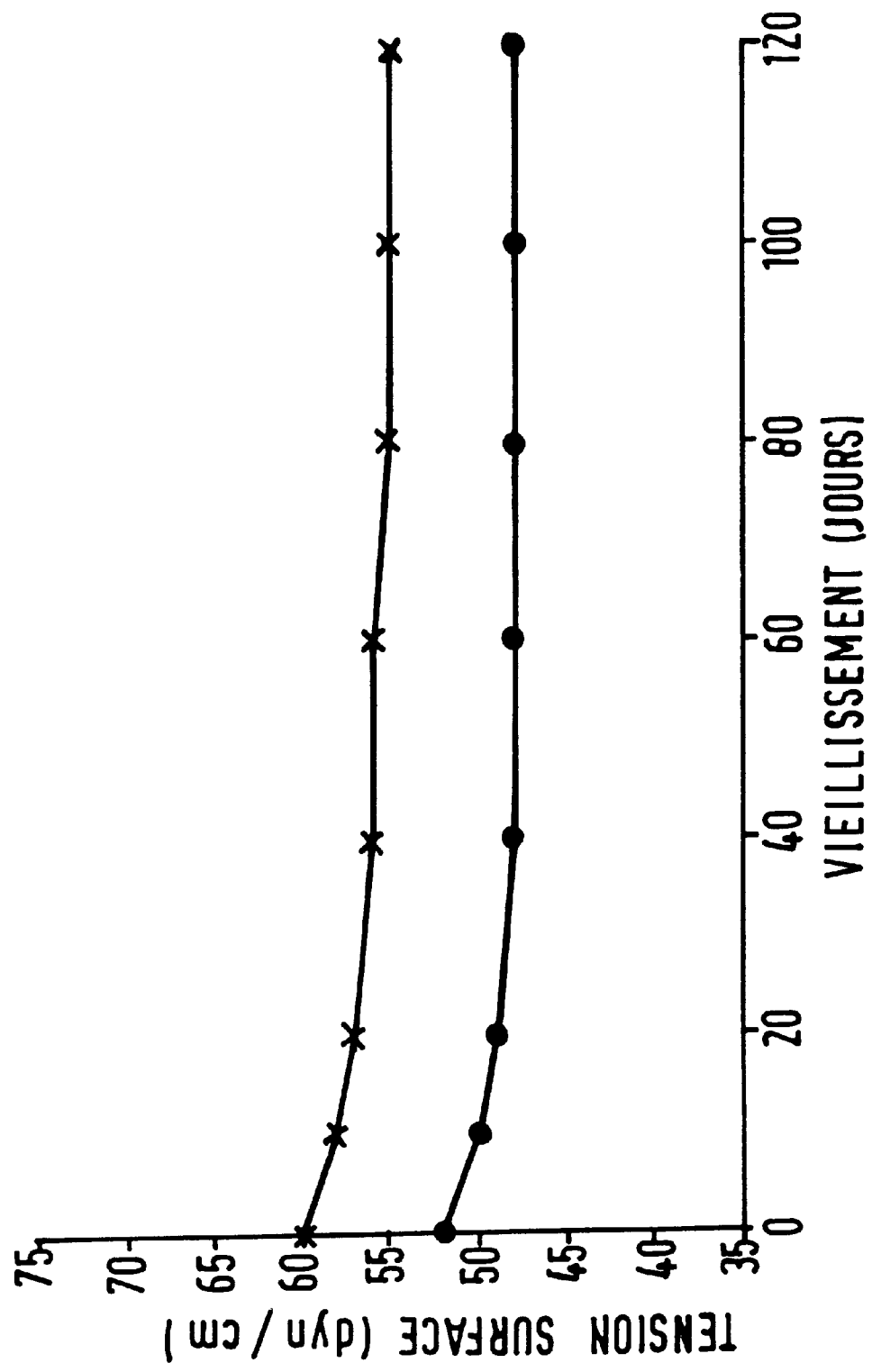
FIG. 4 is an example of results obtained, in terms of surface tension, of polymer films of BOPP ("BiOriented PolyPropylene") type treated using gaseous mixtures prepared according to the invention.

FIG. 4 illustrates the comparative results of Examples 1 and 2 after treatment of the BOPP films using these two types of atmosphere, in terms of surface tension of the treated polymer film as a function of the aging of the film (the point "0" of the aging corresponding to the tested films just exiting from the treatment device 11).

In the figure, the curve with the points (•) corresponds to the results obtained in Example 1, whereas the curve with the crosses (x) corresponds to the results obtained in Example 2.

All these results were obtained by employing a discharge power of 2 kW and thus with a power density of 40 W min/$m^2$ [sic] (power/(width of the film×speed of the film)).

The high surface tension values obtained, moreover for both types of treatment atmosphere, with a notable stability of the surface tension over time, including after several months of aging of the treated films, are then found in this figure.

The difference in surface tension observed between the two types of atmosphere is, in all likelihood, to be related, for the type of polymer film treated here, to a different chemistry (species created at the surface) taking place in the two cases.

What is claimed is:

1. Process for the production of a final gaseous mixture comprising a carrier gas, an oxidizing gas and a silane, with a predetermined content of each of the three gaseous components, comprising the steps of:
    a) preparing a primary gaseous mixture comprising a neutral gas and the silane, wherein the silane is present in the primary gaseous mixture at a content below a self-ignition limit of that particular silane in air;
    b) providing a first gas stream, comprising the carrier gas and a controlled content of said oxidizing gas; and
    c) preparing the final mixture according to one of the following two procedures:
        P1: mixing the first gas stream with a second stream of the primary gaseous mixture and with a third stream of the oxidizing gas in proportions which make it possible to obtain the final mixture, the addition of the oxidizing gas stream being carried out under dynamic conditions;
        P2: mixing the first gas stream with a second stream of the primary gaseous mixture, in proportions which make it possible to obtain the final mixture, the addition of the primary mixture stream being carried out under dynamic conditions.

2. Process according to claim 1, wherein the mixing according to the procedure P1 further comprises the steps of:
    i) preparing an intermediate mixture between said first gas stream and said primary gaseous mixture second stream; and
    ii) adding said third stream of the oxidizing gas to the intermediate mixture in proportions which make it possible to obtain the final mixture.

3. Process according to claim 2 further comprising homogenizing the final mixture thus formed due to the fact that a the pipe in which said first gas stream moves adopts, downstream of points for addition of said primary mixture second stream and of the said third stream of the oxidizing gas, in the case of the procedure P1, or downstream of the point for addition of said primary gaseous mixture second stream, in the case of the step, a coil shape.

4. Process according to claim 1 further comprising homogenizing the final mixture thus formed due to the fact that a pipe in which said first gas stream moves adopts, downstream of points for addition of said primary mixture second stream and of the said third stream of the oxidizing gas, in the case of the procedure P1, or downstream of a point for addition of said primary gaseous mixture second stream, in the case of the procedure P2, a coil shape.

5. Process according to claim 1, wherein the silane is monosilane $SiH_4$.

6. Process according to claim 1, wherein said first gas stream is a nitrogen stream of cryogenic origin and wherein the procedure P1 is then applied.

7. Process according to claim 1, wherein said first gas stream is an impure nitrogen stream obtained by separation from air by permeation or adsorption, comprising a residual oxygen content, and wherein the procedure P2 is then applied.

8. Process according to claim 7 wherein the residual oxygen content in the first gas stream is between 0.1% and 12% by volume.

9. Process according to claim 1, wherein said first gas stream is a dry air stream and wherein the procedure P2 is then applied.

10. Process according to claim 1, wherein said oxidizing gas is oxygen or a gas comprising oxygen.

11. Process according to claim 1, wherein said oxidizing gas is nitrous oxide.

12. Process according to claim 1, wherein said carrier gas is a neutral gas.

13. Process according to claim 12, wherein said neutral gas of said carrier gas and said neutral gas of said primary gaseous mixture are identical.

14. Process according to claim 1, wherein said carrier gas is a mixture of a neutral gas and of a reducing gas.

15. Process according to claim 1, further comprising directing the final gaseous mixture thus formed to at least one user point where a surface treatment operation is performed on polymer films by deposition of a silicon-based layer, under dielectric-barrier electrical discharge.

16. Process according to claim 1, wherein in the case in which the procedure P1 is applied, said first gas stream and said oxidizing gas third stream each move in pipes at a velocity such that the gas velocity in the pipe in which said first gas stream moves is greater than the gas velocity in the pipe in which said oxidizing gas third stream moves, and in the case in which the procedure P2 is applied, the gas velocity in the pipe in which said first gas stream moves is greater than the gas velocity in the pipe in which said primary mixture second stream moves.

17. Process according to claim 16, wherein the procedure P1 is applied, and wherein the gas velocity in the pipe in which the first gas stream moves and the gas velocity in the pipe in which said oxidizing gas third stream moves are at a ratio between 1 and 300.

18. Process according to claim 1, wherein the procedure P2 is applied, and wherein the gas velocity in the pipe in which the first gas stream moves and the gas velocity in the pipe in which said primary mixture second stream moves are at a ratio between 1 and 300.

19. Process for the production of a final gaseous mixture comprising a carrier gas, an oxidizing gas and a silane, with a predetermined content of each of the three gaseous components, comprising the steps of:

a) preparing a primary gaseous mixture comprising a neutral gas and the silane, wherein the silane is present in the primary gaseous mixture at a content below a self-ignition limit of that particular silane in air;

b) providing a first gas stream, comprising the carrier gas and a controlled content of said oxidizing gas; and c) preparing the final mixture according to one of the following two procedures:

P1: mixing the first gas stream with a second stream of the primary gaseous mixture and with a third stream of the oxidizing gas in proportions which make it possible to obtain the final mixture, the addition of the oxidizing gas stream being carried out under dynamic conditions;

P2: mixing the first gas stream with a second stream of the primary gaseous mixture, in proportions which make it possible to obtain the final mixture, the addition of the primary mixture stream being carried out under dynamic conditions;

wherein the ratio between the velocity of the gas stream provided in step b) to the velocity of the gas stream or streams provided in step c) is greater than 1.

* * * * *